US00RE36749E

United States Patent [19]

Meyer

[11] E Patent Number: Re. 36,749

[45] **Reissued Date of Patent: *Jun. 27, 2000**

[54] VIDEO SIGNAL DIGITAL SLICING CIRCUIT

[75] Inventor: Jacques Meyer, Corenc, France

[73] Assignee: SGS-Thomson Microelectronics S.A., Gentilly, France

[ * ] Notice: This patent is subject to a terminal disclaimer.

[21] Appl. No.: 08/280,730

[22] Filed: Jul. 26, 1994

Related U.S. Patent Documents

Reissue of:

[64] Patent No.: 5,136,382
Issued: Aug. 4, 1992
Appl. No.: 07/591,512
Filed: Oct. 2, 1990

[30] Foreign Application Priority Data

Oct. 3, 1989 [FR] France ..... 89 13171

[51] Int. Cl.[7] ..... H04N 7/04; H04N 5/08

[52] U.S. Cl. ..... 348/465; 327/73

[58] Field of Search ..... 348/465, 466, 348/468, 461, 464, 467, 478, 479, 477, 476, 473, 525, 529, 536, 537, 720; 364/724.01, 724.16; 327/73, 72; 375/76; H04N 7/087, 7/088, 7/08, 7/04, 5/08

[56] References Cited

U.S. PATENT DOCUMENTS

| | | | |
|---|---|---|---|
| 4,066,878 | 1/1978 | Miller et al. | 364/724 |
| 4,318,128 | 3/1982 | Sauvanet | 358/147 |
| 4,656,513 | 4/1987 | Langenkamp | 358/147 |
| 4,667,235 | 5/1987 | Nozoe et al. | 358/147 |
| 4,858,007 | 8/1989 | Schweer et al. | 358/147 |

FOREIGN PATENT DOCUMENTS

| | | | |
|---|---|---|---|
| 55-60419 | 4/1981 | Japan | H03K 5/08 |
| 60-18079 | 1/1985 | Japan | H04N 7/08 |
| 60-163528 | 8/1985 | Japan | H03K 5/01 |
| 61-43886 | 3/1986 | Japan | H04N 7/08 |

*Primary Examiner*—Sherrie Hsia
*Attorney, Agent, or Firm*—Wolf, Greenfield & Sacks, P.C.; James H. Morris; Theodore E. Galanthay

[57] ABSTRACT

An extractor for digital data transmitted at a first determined frequency (f0) through a video channel after a burst of 0s and 1s emitted at a first frequency (f0). A comparator (1) compares the input signal with a threshold level. A threshold level is provided by an up/down counter (12) operating at a frequency (F0) multiple of the first frequency, the up/down counting input of which is connected to the output of the comparator (1), and a digital/analog converter (16) receiving the output of the up/down counter and supplying the threshold level ($V_T$).

13 Claims, 3 Drawing Sheets

VIDEO SIGNAL DIGITAL SLICING CIRCUIT

Matter enclosed in heavy brackets [ ] appears in the original patent but forms no part of this reissue specification; matter printed in italics indicates the additions made by reissue.

BACKGROUND OF THE INVENTION

The invention generally relates to the reception of digital signals transmitted on a TV channel.

Many systems use the existing TV emitter network for transmitting digital data. For example, one can cite systems for transmitting messages or systems for triggering an actuator, for example an automatic video tape recorder start at the beginning of a TV programme.

Generally, digital signals are emitted within the free time period existing during the frame retrace period of the TV signal.

It is assumed in the following that the TV receiver has conventionally identified the frame retrace periods and is therefore capable of establishing, at least approximately, windows during which digital signals are liable to appear. More particularly, during each frame retrace period, two windows are formed, the first one during which appear emitted signals constituted by an alternate succession of zeros and ones and the second window during which appear the desired data signals.

In order to detect (or to extract) digital data, it is necessary, at each incoming data clock cycle, to determine whether the level is high or low (1 to 0), that is, to compare the incoming data with one (or two) decision thresholds. On the other hand, this comparison is to be made at an appropriate time during the clock cycle, that is, it is necessary to adjust the clock phase.

A recognition device is very schematically illustrated in FIG. 1: the incoming signals $V_{IN}$ are supplied to the first input of a comparator 1, the second input of which is connected to a threshold voltage $V_T$; the comparator output is connected to a flip-flop 2 actuated by a clock f0 corresponding to the digital data rate.

This analysis is delicate due to the various parasitic pulses added to the video signal. FIG. 2 illustrates an exemplary digital signal comprising, during a window W1, an alternate succession of zeros and ones, then, during a window W2, a digital word, for example 111100111000 . . . As illustrated in FIGS. 2B and 2C, the signal arriving on comparator 1 is not the ideal signal of FIG. 2 but a signal having a pass-band intentionally limited at the emission and impaired by the transmission.

On the one hand, as shown by comparing FIG. 2B with FIG. 2C, the digital data amplitude is liable to vary within an important ratio, usually ranging from 1 to 4 if, as conventional, the gain of the video signal input receiver is controlled on the average amplitude of the video signal during the frame. Thus, this gain will be high in case of a dark image (case of FIG. 2C) and low in case of a light image (case of FIG. 2B).

On the other hand, the phase and amplitude of the signals are impaired by filtering and adjustment inaccuracies at the TV input, as well as by echo receptions and other parasitic pulses.

Lastly, the random noise accompanying any transmitted signal may be significant.

As a result, the threshold voltage $V_T$ with which is compared the input signal $V_{IN}$ has to be adjusted as a function of the input signal amplitude. It is desirable that the level $V_T$ is adjusted to a value substantially equal to half the peak amplitude of the input signal. Then, fluctuations associated with noise are avoided. On the other hand, it is desirable that detection is made substantially in the middle of the time duration of a 1 or a 0 in order to be in the area where the noise has the lowest influence.

In the prior art, in order to solve this problem, one has resorted to approaches of the analog or digital type.

The conventional analog-type approaches consist in storing, after passage in a low-pass filter, the peak level on a capacitor for subsequently supplying from that point the detection level. It is also possible to detect and store on a capacitor the maximum and minimum data levels and to add their half sum. In order to determine the phase, one conventionally uses phase locked loops, the various reference values of which are stored by capacitors. The drawbacks of those analog approaches are well known: the component values are critical and require accurate adjustments; the storage of those values is delicate since the latter is sensitive to noise and depends upon the signal content; lastly, those approaches require the use of high value capacitors and an inductance for the phase locked loop oscillator; those components being not integrable, it is necessary to provide on the integrated circuit connection pads for external components.

The conventional digital-type approaches consist in digitally converting the incoming signal with an analog-digital converter (ADC); then, the signal is digitally processed in various ways (correlation, digital filtering, echo cancellation, etc). This approach has the advantage over the digital approach to use integrable components but it exhibits the drawback that the ADC must operate at a high frequency with respect to the input signal frequency which is, conventionally in the TV field, of about a few MHz. Moreover, it will be generally necessary to provide digital multipliers and all those circuits are relatively complex and occupy an important silicon surface.

SUMMARY OF THE INVENTION

Thus, an object of the invention is to provide a digital data extractor in a TV signal which is particularly simple to implement and the components of which are integrable.

To achieve this purpose, the invention provides an extractor for digital data transmitted at a first frequency determined by a video channel after a burst of Os and 1s emitted at the first frequency, comprising a comparator for comparing the input signal with a threshold level, means for supplying a second frequency multiple of the first frequency, and means for supplying said threshold level, operating during the burst, wherein the means for supplying the threshold level comprise an up/down counter operating at the multiple frequency and the up/down counting input of which is connected to the comparator output, a digital/analog converter (DAC) receiving the output of the up/down counter and supplying the threshold level. Moreover, the comparator output is connected to an edge detector acting, during the burst, on a divider by N of the multiple frequency for supplying to a flip-flop connected to the comparator output a clock signal at the first frequency with the desired phase relationship.

According to an embodiment of the invention, the DAC is of the exponential type.

According to another embodiment of the invention, the comparator output is connected to a digital filter of the majority detection type.

An advantage of the circuit according to the invention is its simplicity, especially due to the fact that the above multiple frequency can be only four to six times higher than the data rate. Moreover, as will be shown in the following example, the up/down counter and DAC can be devices comprising a small number of bits and will occupy a small silicon surface while supplying a relatively accurate threshold level.

BRIEF DESCRIPTION OF THE DRAWINGS

The foregoing and other objects, features and advantages of the invention will be apparent from the following detailed description of preferred embodiments as illustrated in the accompanying drawings wherein.

DETAILED DESCRIPTION OF THE INVENTION

Figure 1:
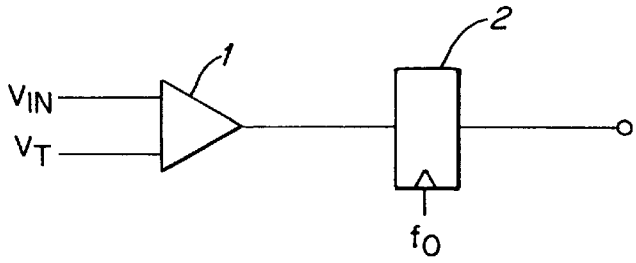
FIG. 1 (PRIOR ART)
FIGS. 1 and 2A–2C, designed to explain the state of the art and to evidence the problem encountered, have been described above.
Figure 3:
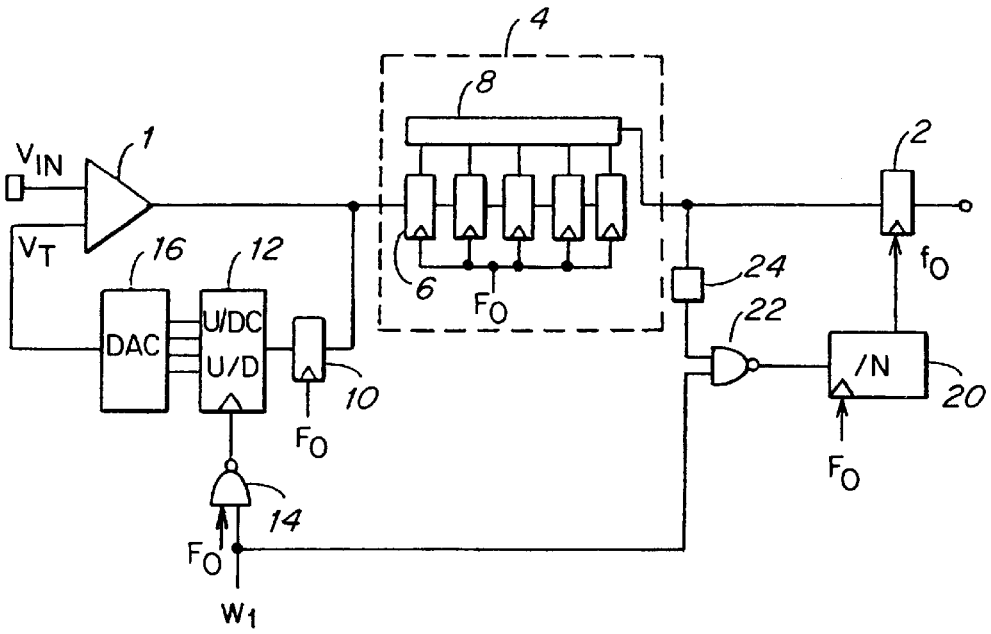
FIG. 3 schematically shows a data extractor circuit according to the invention.

The circuit according to the invention illustrated in FIG. 3 comprises, like the prior art circuit illustrated in FIG. 1, a comparator 1 receiving on a first input the voltage $V_{IN}$ of the signal comprising digital data and, on a second input, the threshold voltage $V_T$ with which this input voltage has to be compared. The output of comparator 1 is also supplied to a flip-flop 2 actuated at the frequency f0 of the digital data. Between comparator 1 and flip-flop 2 is inserted a digital filter 4 comprising for example a succession of D-type flip-flops 6 actuated at a frequency F0 multiple of the frequency f0 and supplied from the latter. A so-called majority detection logic circuit 8 supplies a signal corresponding to the one supplied by the highest number of flip-flops 6 which are for example five in number.

Figure 2A:
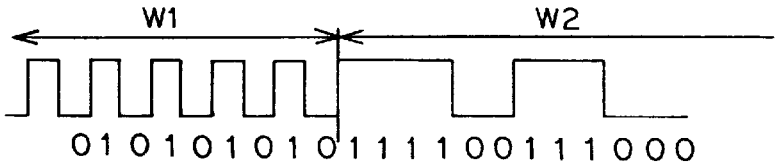
FIG. 2A (PRIOR ART)
Figure 2B:
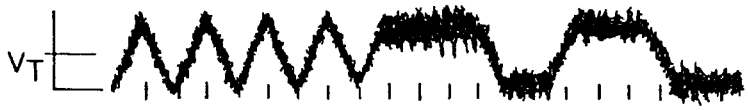
FIG. 2B (PRIOR ART)
Figure 2C:
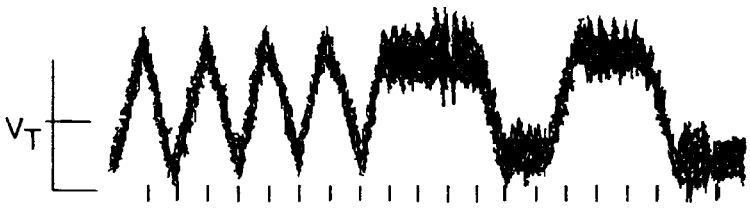
FIG. 2C (PRIOR ART)

The threshold voltage $V_T$ is supplied by a loop comprising a second flip-flop 10 connected to the output of comparator 1 and actuated at the clock frequency F0. An up/down counter (U/D C) 12 receives on its up/down (U/D) counting input the output of flip-flop 10 and on its clock input, through an NAND gate 14, the clock signal F0 during the duration of the window W1 mentioned above in relation with FIG. 2A. Thus, the U/D C 12 will operate only during the duration of this window, that is, during the initial burst duration of alternate zeros and ones preceding each data arrival. The output of U/D C 12 is connected to a DAC 16, the analog output of which corresponds to the threshold voltage $V_T$.

The sampling signal f0 of the first flip-flop 2 supplying the desired data is supplied by a divider by N, 20, (F0=Nfo), this divider receiving the clock frequency F0 and being reset by the output of an NAND gate 22, the first input of which receives the window signal W1 and the second input receives the output of the digital filter 4 through an edge detector 24.

The operation of this circuit during the duration of window W1 will now be explained in relation with FIG. 4. This figure shows, on the one hand, the shape of the input signal $V_{IN}$ during the window W1 and, on the other hand, the output of converter 16 (referenced 16) permitting to establish the signal $V_T$ which will be used during the window W2. It is assumed that the initial output value of the DAC 16 is equal to vO. This value is shown in the figure as being a low value. The comparison of this value vO with value $V_{IN}$ causes signal 16 to increase during the first positive half-period. The comparator 1 determines whether $V_{IN}$ is higher than vO and flipflop 10 actuates the U/D C 12 in the up-counting direction. Thus, the DAC 16 supplies at the frequency F0 a step-increasing voltage. Then, this voltage decreases during the negative half-periods and so on. As long as the output of the DAC 16 is below the substantially median value of the sine wave corresponding to signal $V_{IN}$, the increase phases will be longer than the decrease phases; then, this output will vary around an average value, the increase phases having substantially the same duration as the decrease phases. Therefore, at the end of window W1, one obtains an output value of the DAC 16 which will be substantially equal to the average sine wave value.

Therefore, one has solved with the invention, in a very simple way, the problem of establishing a threshold voltage $V_T$ substantially equal to the average value of the input signal during the initial adjustment burst.

It is also necessary to adjust the phase of signal f0 in order, during data extraction, to carry out the extraction at the vicinity of a minimum or a maximum of the received signals, that is, substantially in the middle of their duration. To achieve this purpose, the invention uses the edge detector 24 connected through the NAND gate 22 to the reset input of the divider by N, 20. Thus, this divider by N supplies the frequency f0 from the frequency F0, with a frequency readjustment at each transition to 0 or 1 of the output of comparator 1 such as filtered by filter 4. It will suffice to take a counter output shifted by a sufficient number of steps of frequency F0 with respect to resets for obtaining the proper phase signal f0 while taking into account the characteristics of the digital filter 4.

All circuits used in the invention in relation with FIG. 3 are conventional for those skilled in the art.

Figure 5:
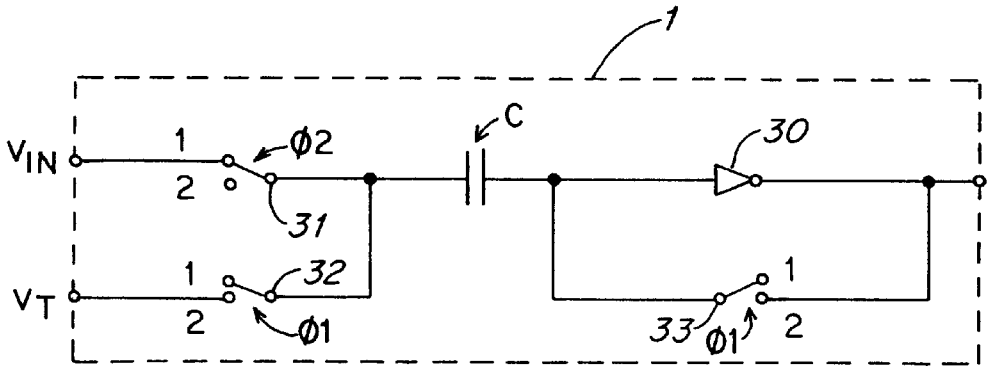
FIG. 5 shows an exemplary comparator usable according to the invention.

As regards the comparator 1, it will be possible to use an auto-zero comparator as the one illustrated in FIG. 5 comprising a capacitor C and an amplifier-inverter 30 as well as a first switch 31 connected between input $V_{IN}$ and a first capacitor terminal, a second switch 32 connected between input $V_T$ and the first terminal of the capacitor and a third switch 33 connected in parallel with the inverter 30. Switches 32 and 33 are on during a first phase $\phi$1 of the clock period F0 and switch 31 is on during a second phase $\phi$2 of this period. As known, this circuit permits avoiding the defects associated with the comparator offset.

Figure 6:
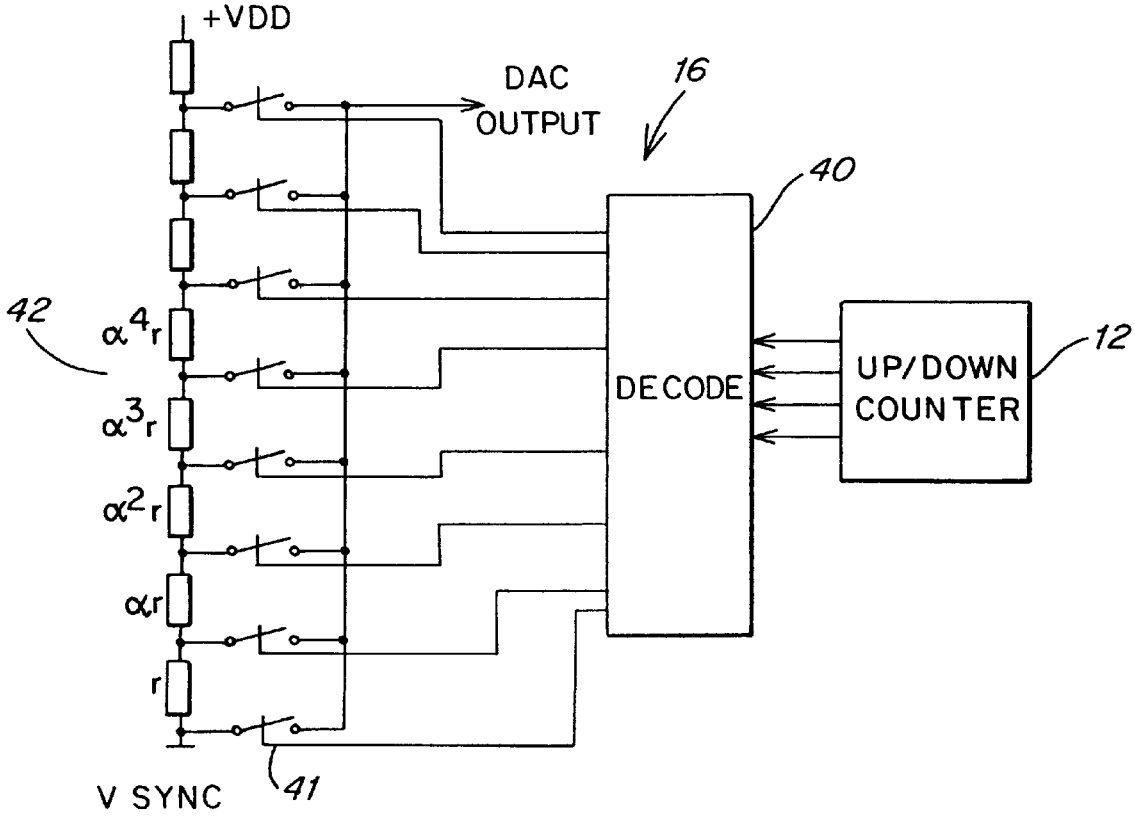
FIG. 6 shows an exemplary DAC usable according to the invention.

The DAC 16 can be of the type illustrated in FIG. 6 comprising a decoding circuit 40 receiving the outputs of counter 12 and controlling the switches 41 of a dividing bridge 42. Preferably, the dividing bridge is of the exponential type, that is, resistors have successive values r, ar, $a^2$r, $a^3$r . . . Thus, the output square pulses of the DAC are rapidly adapted to the value of voltage $V_{IN}$ even if the latter varies within a wide range as above mentioned.

In a practical implementation, the duration of the clock burst is sixteen periods, that is, eight alternate cycles of zeros and ones. Thus, the detection system has to be rapid enough for finding the signal level within eight cycles. The input signal frequency is about 7 MHz. If N=6, then F0=42 MHz and the DAC will include sixteen exponential low levels, the U/D C having a capacity of six bits, the four more significant bits only being connected to the DAC.

Figure 4:
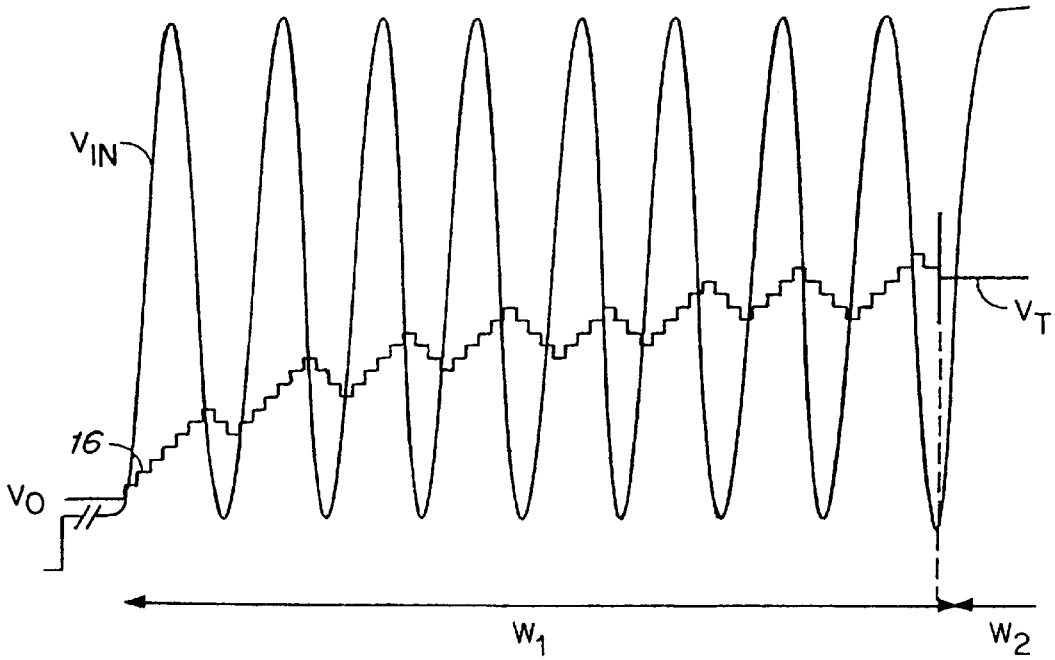
FIG. 4 shows signals at various points of the circuit of FIG. 3 for illustrating the operation thereof.

Preferably, unlike what is shown in FIG. 4 wherein the output initial value v0 of the counter is low, the counter will be initialized at half its value. So, the counter will rapidly reach extreme values within 32 periods at frequency F0, that is, within the first third of the clock period.

Preferably also, the exponential variation law of the converter will be calculated so that the number of levels between the extreme values of the input signal is independent of the signal amplitude. Thus, the behaviour of the system is constantly the same, the average level only of the U/D C varying as a function of the average amplitude of the video signal during the clock burst.

Other advantages of the invention will be easily devised by those skilled in the art according to the type of circuit most easily implementable in the used integrated circuits technology.

I claim:

1. An extractor for digital data transmitted at a first determined frequency (fo) through a video channel after an input signal including a burst of Os and 1s is emitted at said first frequency (fo) onto a first input (VIN) of a comparator (1) for comparing said input signal with a threshold level, the extractor including means for supplying a second frequency (F0) as a multiple by N of the first frequency (fo), and means for supplying said threshold level, operating during said burst [duration], wherein the means for supplying the threshold level comprises:

an up/down counter (12) operating at said multiple frequency (F0), the counter including an up/down counting input connected to an output of said comparator (1), and a digital/analog converter (16) receiving an output of the up/down counter and supplying said threshold level (VT); and wherein the comparator output is connected to an edge detector (24) acting, during said burst, on a divider by N (20) of the second frequency (F0) for supplying to a flip-flop (2), connected to the comparator output, a clock signal at the first frequency (fo) with a desired phase relationship.

2. A digital data extractor according to claim 1, wherein the digital/analog converter (16) is of an exponential type.

3. A digital data extractor according to claim 1, wherein the comparator output is connected to a digital filter of a majority detection type (6, 8).

4. A digital data extractor according to claim 1, further including phasing means for establishing during said burst a predetermined phase for said clock signal relative to the output of said comparator, said phasing means comprising said edge detector, said flip-flop and said divider by N, said clock signal derived by said divider by N from said second frequency, said flip-flop sampling the output of said comparator at said first determined frequency (fo) and at said predetermined phase.

5. An extractor for digital data transmitted at a first predetermined frequency (fo) through a video channel after an input signal including a burst of 0s and 1s is emitted at said first frequency (fo), including:

a comparator (1) for comparing said input signal with a threshold level, said comparator having a first input (VIN) receiving the digital data and the burst of 0s and 1s;

means for supplying a second frequency (F0) as a multiple by N of the first frequency (fo), and means for supplying said threshold level, operating during said burst [duration];

said means for supplying the threshold level comprising:

an up/down counter (12) operating at said multiple frequency (F0), the counter including an up/down counting input connected to an output of said comparator (1); and a digital/analog converter (16) receiving an output of the up/down counter and supplying said threshold level (VT); and further including phasing means for establishing a predetermined phase for a sampling signal derived from said second frequency, said phasing means comprising:

an edge detector (24) connected to receive the output of said comparator;

a divider by N (20) operating on the second frequency (F0), said divider by N responsive to an output of said edge detector;

means for providing the output of said edge detector to said divider by N only during said burst; and a flip-flop (2) connected for sampling the comparator output, said flip-flop receiving from said divider by N a sampling signal having said predetermined phase at the first frequency (fo).

*6. A circuit for extracting digital data from an input signal comprising:*

*a comparator, receiving the input signal having a first frequency and a threshold voltage, comparing the input signal with the threshold voltage and providing an output;*

*a first circuit, coupled to the comparator, for sampling the output of the comparator at a frequency controlled by a first clock signal;*

*a threshold voltage generation circuit including:*

*an up/down counter, coupled to the output of the comparator, and operating at a second frequency to provide an output, the second frequency being a multiple greater than the first frequency; and*

*a digital-to-analog converter, coupled between the comparator and the up/down counter, receiving the output of the up/down counter and providing the threshold voltage; and*

*a phase adjusting circuit including:*

*an edge detector, coupled to the comparator, receiving the output of the comparator and providing an output; and*

*a divider, coupled to the edge detector, responsive to the output of the edge detector and operating at the second frequency for producing the first clock signal at the first frequency having a phase adjusted in response to the output of the edge detector.*

*7. A circuit as claimed in claim 6 further including a digital filter coupled between the comparator and the first circuit, receiving the output of the comparator, filtering the output of the comparator, and providing the filtered comparator output to the first circuit.*

*8. A circuit as claimed in claim 7 wherein the first circuit includes a flip-flop.*

*9. A circuit as claimed in claim 8 wherein the digital filter includes a plurality of flip-flops connected in cascade and a majority detection logic circuit, coupled to each flip-flop.*

*10. Circuitry for use with a digital data extraction circuit including a comparator for comparing an input signal having a first frequency with a threshold voltage and providing an output signal, and a first circuit for sampling the output of the comparator at a frequency controlled by a first clock signal, the circuitry comprising:*

*a threshold voltage generation circuit including:*

*an up/down counter, coupled to the output of the comparator, and operating at a second frequency to provide an output, the second frequency being a multiple greater than the first frequency; and*

*a digital-to-analog converter, coupled between the comparator and the up/down counter, receiving the output of the up/down counter and providing the threshold voltage; and*

*a phase adjusting circuit including:*

*an edge detector, coupled to the comparator, receiving the output of the comparator and providing an output; and*

*a divider, coupled to the edge detector, responsive to the output of the edge detector and operating at the second frequency for producing the first clock signal at the first frequency having a phase adjusted in response to the output of the edge detector.*

*11. Circuitry as claimed in claim 10 further including a digital filter, coupled between the comparator and the first circuit, receiving the output of the comparator, filtering the output of the comparator, and providing a filtered comparator output to the first circuit.*

*12. Circuitry as claimed in claim 11 wherein the first circuit includes a flip-flop.*

*13. Circuitry as claimed in claim 12 wherein the digital filter includes a plurality of flip-flops connected in cascade and a majority detection logic circuit, coupled to each flip-flop.*

* * * * *